United States Patent [19]

Chung et al.

[11] Patent Number: 5,214,656
[45] Date of Patent: May 25, 1993

[54] MULTIPLEXED CODED MODULATION WITH UNEQUAL ERROR PROTECTION

[75] Inventors: Hong Y. Chung, Eatontown; Jin-Der Wang, Ocean; Lee-Fang Wei, Lincroft, all of N.J.

[73] Assignee: AT&T Bell Laboratories, Murray Hill, N.J.

[21] Appl. No.: 627,156

[22] Filed: Dec. 13, 1990

[51] Int. Cl.[5] .............................................. G06F 11/00
[52] U.S. Cl. ......................................... 371/43; 375/39
[58] Field of Search ........................ 371/37, 38, 43–46; 375/39, 58

[56] References Cited

PUBLICATIONS

U.S. patent application Ser. No. 7/363,793, Wang et al., filed Jun. 9, 1989.

Primary Examiner—Vincent P. Canney
Attorney, Agent, or Firm—Henry T. Brendzel

[57] ABSTRACT

Unequal error protection is provided for an HDTV signal by separately coding each one of the classes of information in the HDTV signal by using a conventional coded modulation scheme and then time-division-multiplexing the various coded outputs for transmission. In particular, each class of information is separately coded by a 4-dimensional 8-state trellis code and a uniformly-spaced (QAM) signal constellation.

32 Claims, 7 Drawing Sheets

| BIT CONVERTER IN FIG. 3 | |
|---|---|
| INPUT BIT PATTERN* | OUTPUT BIT PATTERN* |
| 0 0 0 0 | 0 0 0 0 |
| 0 0 0 1 | 0 0 0 1 |
| 0 0 1 0 | 0 0 1 1 |
| 0 0 1 1 | 0 0 1 0 |
| 0 1 0 0 | 0 1 0 1 |
| 0 1 0 1 | 0 1 1 1 |
| 0 1 1 0 | 0 1 1 0 |
| 0 1 1 1 | 0 1 0 0 |
| 1 0 0 0 | 1 1 1 1 |
| 1 0 0 1 | 1 1 1 0 |
| 1 0 1 0 | 1 1 0 0 |
| 1 0 1 1 | 1 1 0 1 |
| 1 1 0 0 | 1 0 1 0 |
| 1 1 0 1 | 1 0 0 0 |
| 1 1 1 0 | 1 0 0 1 |
| 1 1 1 1 | 1 0 1 1 |

*READING FROM TOP TO BOTTOM IN FIG. 3

COMPARISONS OF MULTIPLEXED CODED MODULATION

| SCHEME | PERCENTAGE OF IMPORTANT DATA (%) | MORE IMPORTANT DATA | | | LESS IMPORTANT DATA | | | $t_1/t_2$ OF MULTIPLEXER | PEAK-TO-AVERAGE POWER RATIO |
|---|---|---|---|---|---|---|---|---|---|
| | | $m_1$ | CONSTELLATION (A) | NOMINAL CODING GAIN (dB)** | $m_2$ | CONSTELLATION (B) | NOMINAL CODING GAIN (dB)** | | |
| 1 | 37.5 | 3 | 12-QAM | 7.6 | 5 | 48-QAM | 1.5 | T/T | 2.07 |
| 3 | 50 | 3 | 12-QAM | 7.6 | 6 | 96-QAM | -1.5 | 2T/T | 2.17 |
| 4 | 62.5 | 3.5 | 16-QAM | 6.0 | 5.25 | 60-QAM | 0.8 | 5T/2T | 2.24 |

** RELATIVE TO UNCODED 16-QAM

FIG. 9
TRANSMITTER 400

MULTIPLEXED CODED MODULATION WITH UNEQUAL ERROR PROTECTION

BACKGROUND OF THE INVENTION

The present invention relates to the transmission of digital data, particularly the transmission of digital data which represents video signals.

It is generally acknowledged that some form of digital transmission will be required for the next generation of television (TV) technology, conventionally referred to as high definition television, or HDTV. This requirement is due mostly to the fact that much more powerful video compression schemes can be implemented with digital signal processing than with analog signal processing. However, there has been some concern about becoming committed to an all-digital transmission system because of the potential sensitivity of digital transmission to small variations in signal-to-noise ratio, or SNR, at the various receiving locations.

This phenomenon—sometimes referred to as the "threshold effect"—can be illustrated by considering the case of two television receivers that are respectively located at 50 and 63 miles from a television broadcast station. Since the power of the broadcast signal varies roughly as the inverse square of the distance, it is easily verified that the difference in the amount of signal power received by the television receivers is about 2 dB. Assume, now, that a digital transmission scheme is used and that transmission to the receiver that is 50 miles distant exhibits a bit-error rate of $10^{-6}$. If the 2 dB of additional signal loss for the other TV set translated into a 2 dB decrease of the SNR at the input of the receiver, then this receiver will operate with a bit-error rate of about $10^{-4}$. With these kinds of bit-error rates, the TV set that is 50 miles away would have a very good reception, whereas reception for the other TV set would probably be very poor. This kind of quick degradation in performance over short distances is generally not considered acceptable by the broadcasting industry. (By comparison, the degradation in performance for presently used analog TV transmission schemes is much more graceful.)

There is thus required a digital transmission scheme adaptable for use in television applications which overcomes this problem. Solutions used in other digital transmission environments—such as the use of a) regenerative repeaters in cable-based transmission systems or b) fall-back data rates or conditioned telephone lines in voiceband data applications—are clearly inapplicable to the free-space broadcast environment of television.

The co-pending, commonly assigned United States patent application of V. B. Lawrence et al. entitled "Coding for Digital Transmission," Ser. No. 07/611,225, filed on Nov. 07, 1990, discloses a technique for overcoming the shortcomings of standard digital transmission for over-the-air broadcasting of digital TV signals. Specifically, the Lawrence et al. patent application teaches the notion of characterizing the HDTV signal into classes of "less important" and "more important" information which will then use a constellation of non-uniformly spaced signal points. This approach provides unequal error protection, i.e., more error protection for the more important information, and allows a graceful degradation in reception quality at the TV set location because, as the bit-error rate at the receiver begins to increase with increasing distance from the broadcast transmitter, it will be the bits that represent proportionately less of the TV signal information that will be the first to be affected.

SUMMARY OF THE INVENTION

Although the Lawrence et al. patent application teaches an advantageous technique for providing unequal error protection to a plurality of classes of information within a signal, we have discovered an alternative, and also advantageous, technique for providing unequal error protection. Specifically, and in accordance with the present invention, unequal error protection is provided for a signal comprised of a plurality of classes of information by a) separately coding each one of the plurality of classes of information using a different coded modulation scheme and b) multiplexing the plurality of coded outputs for transmission.

In accordance with a feature of the invention, uniformly spaced signal points can be used.

In a preferred embodiment of the invention, an HDTV signal is source-encoded to provide a plurality of classes of information. Each class of information is then separately coded by a different, and conventional, coded modulation scheme, e.g., a 4D 8-state trellis code and a uniformly-spaced QAM signal constellation. The coded outputs of the separate coded modulation schemes are then time-division-multiplexed for transmission of the HDTV signal.

DETAILED DESCRIPTION

Before proceeding with a description of the illustrative embodiment, it should be noted that the various digital signaling concepts described herein—with the exception, of course, of the inventive concept itself—are all well known in, for example, the digital radio and voiceband data transmission (modem) arts and thus need not be described in detail herein. These include such concepts as multidimensional signaling using 2N-dimensional channel symbol constellations, where N is some integer; trellis coding; fractional coding; scrambling; passband shaping; equalization; Viterbi, or maximum-likelihood, decoding; etc. These concepts are described in such United States patents as U.S. Pat. No. 3,810,021, issued May 7, 1974 to I. Kalet et al.; U.S. Pat. No. 4,015,222, issued Mar. 29, 1977 to J. Werner; U.S. Pat. No. 4,170,764, issued Oct. 9, 1979 to J. Salz et al.; U.S. Pat. No. 4,247,940, issued Jan. 27, 1981 to K. H. Mueller et al.; U.S. Pat. No. 4,304,962, issued Dec. 8, 1981 to R. D. Fracassi et al.; U.S. Pat. No. 4,457,004, issued Jun. 26, 1984 to A. Gersho et al.; U.S. Pat. No. 4,489,418, issued Dec. 18, 1984 to J. E. Mazo; U.S. Pat. No. 4,520,490, issued May 28, 1985 to L.-F. Wei; U.S. Pat. No. 4,597,090, issued Jun. 24, 1986 to G. D. Forney, Jr. and U.S. Pat. No. 4,941,154, issued Jul. 10, 1990 to L. -F. Wei. Additionally, reference can also be made to "Efficient modulation for band-limited signals", G. D. Forney, Jr. et al., *IEEE J. Select. Areas Commun.*, vol. SAC-2, pp. 632–647, September 1984; "Trellis-coded modulation with multidimensional constellations", L. -F. Wei, *IEEE Trans. Inform. Theory*, vol. IT-33, pp. 483–501, July 1987; and "Multidimensional constellations-Part I: Introduction, figures of merit, and generalized cross constellations," G. D. Forney, Jr. & L. -F. Wei, *IEEE J. Select. Areas Commun.*, vol. SAC-7, pp. 877–892, August 1989. All of the above are hereby incorporated by reference.

As previously mentioned, the co-pending, U.S. patent application of V. B. Lawrence et al., Ser. No. 07/611,225, filed on Nov. 7, 1990, discloses a technique for overcoming the shortcomings of standard digital transmission for over-the-air broadcasting of digital TV signals. Specifically, the Lawrence et al. patent application teaches the notion of characterizing the HDTV signal into classes of "less important" and "more important" information which will then use a constellation of non-uniformly spaced signal points. This approach provides unequal error protection, i.e., more protection for the more important information, and allows a graceful degradation in reception quality at the TV set location because, as the bit-error rate at the receiver begins to increase with increasing distance from the broadcast transmitter, it will be the bits that represent proportionately less of the TV signal information that will be the first to be affected. However, we have discovered an alternative, also advantageous, technique for providing unequal error protection. Specifically, and in accordance with the present invention, unequal error protection is provided for a signal comprised of a plurality of classes of information by a) separately coding each one of the plurality of classes of information using a different coded modulation scheme and b) multiplexing the plurality of coded outputs for transmission. Before proceeding with a description of three illustrative embodiments of the invention, the inventive concept itself will generally be described.

Figure 1:
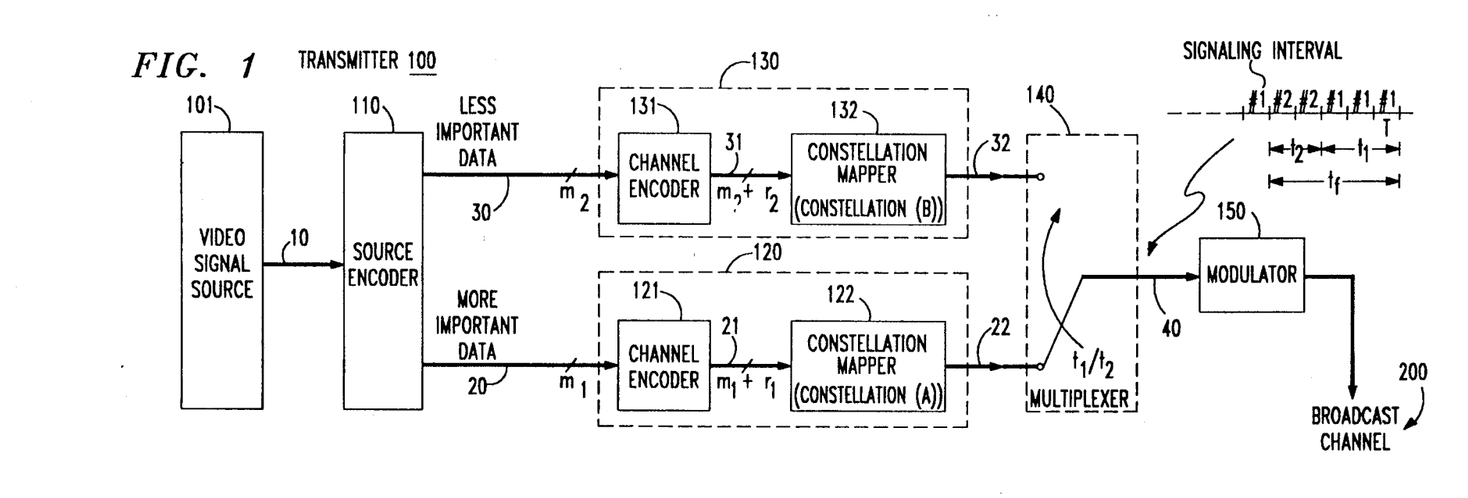
FIG. 1 is a block diagram of an illustrative transmitter embodying the principles of the invention.

Turning, in particular, to FIG. 1, information signal source 101 generates an HDTV analog video signal (HDTV signal) representing picture information. The HDTV signal is passed on to source encoder 110 which generates a digital signal comprised of a plurality of data elements which are grouped into "classes of information" in which at least one class of information is more important, i.e., contains "more important data", than the remainder of the classes of information which, therefore, contain "less important data". For example, the more important data represents that information which, if properly received, will form a rough picture, e.g., audio information, framing information, etc., and the less important data represents that information which comprises the remainder of the HDTV signal. As represented herein, the more important data is generated on lead 20 and the less important data is generated on lead 30. Illustratively, each data element is a data bit, with an average of $m_1$ ($m_2$) bits being generated on lead 20 (30) for each signaling interval assigned by multiplexer 140 to the more (less) important data (see below), each signaling interval having a duration of T seconds.

As shown in FIG. 1, the more important data on lead 20 is input to channel encoder 121 of coded modulation circuitry 120, and the less important data on lead 30 is input to channel encoder 131 of coded modulation circuitry 130. Coded modulation circuitry 120 (130) represents a coded modulation scheme and is comprised of channel encoder 121 (131) and constellation mapper 122 (132). In accordance with a principle of the invention, the coded modulation schemes implemented by coded modulation circuitry 120 and 130 (described below) are chosen such that the more important data is provided more error protection than the less important data, i.e., coded modulation circuitry 120 and 130 are different, with channel encoders 121 and 131, and/or constellation mappings 122 and 132 being different from each other. Channel encoder 121 (131) operates in accordance with known encoding techniques (described below), and the "encoded output" of channel encoder 121 (131) consists of $m_1+r_1$ ($m_2+r_2$) data bits, where $r_1$ ($r_2$) represents the average number of redundant bits introduced by the encoder 121 (131) in each signaling interval assigned by multiplexer 140 to the more (less) important data. The encoded output of channel encoder 121 (131) is mapped to a signal point from constellation A (B), for each assigned signaling interval, by constellation mapper 122 (132) to provide the "coded output" on leads 22 (32) to multiplexer 140.

Multiplexer 140, illustratively a time-division-multiplexer, is shown as a switch with a design parameter $t_1/t_2$, i.e., over a time frame $t_f=t_1+t_2$, multiplexer 140 will switch between coded modulation circuitry 120 and 130. For example, during the time interval $t_1$ multiplexer 140 will provide the coded output from coded modulation circuitry 120 to modulator 150, and during the time interval $t_2$ multiplexer 140 will provide the coded output from coded modulation circuitry 130 to modulator 150. (It should be noted that although the simple case of only two classes of information is described herein, the concept can easily be extended to a larger plurality of classes.) Each time interval $t_i$, for $i=1,2$, is comprised of a number of signaling intervals, T, i.e., $t_1=N_1T$ and $t_2=N_2T$, where $N_1(N_2)$ is the number of signaling intervals in $t_1$ ($t_2$). In fact, the design parameter $t_1/t_2$ denotes the ratio of the numbers of signaling intervals assigned to the more important data and the less important data (i.e., the signaling intervals assigned to channel encoders 121 and 131). For example, for each signaling interval in $t_1$ ($t_2$), channel encoder 121 (131) is mapped to a signal point from constellation A (B) so that over the time interval $t_1$ ($t_2$) the coded output of coded modulation circuitry 120 (130) will be comprised of $N_1$ ($N_2$) signal points. Therefore, and in accordance with the principles of the present invention, by allocating separate time intervals to the more important data and the less important data in a time frame, $t_f$, the more important data can be separately and differently coded from the less important data. Further, by changing the ratio of $t_1/t_2$, additional flexibility can be achieved in the design of the separate coding schemes to provide further error protection for the more important data at the expense of the less important data. For example, by increasing the duration of $t_1$ relative to $t_2$, the size of the signal constellation used by constellation mapper 122 can be smaller, i.e. the signal points can be spaced further apart, however, this will result in $t_2$ being smaller, which will require constellation mapper 132 to use a larger constellation of signal points, i.e., the signal points which will be closer together. As a result, since the distance between signal points in a constellation has an effect on the amount of error protection provided by a coded modulation scheme, the error protection of the more important data is enhanced as the expense of the less important data. Coded modulation circuitry 120 and 130, and multiplexer 140 are illustrative of an implementation of a "multiplexed coded modulation scheme". The bandwidth efficiency of the multiplexed coded modulation scheme of FIG. 1 is given by $(m_1 t_1 + m_2 t_2)/(t_1 + t_2)$ data bits per signaling interval, with the fraction of more important data being $(m_1 t_1)/(m_1 t_1 + m_2 t_2)$ of the total. The coded outputs from the multiplexed coded modulation scheme are provided to modulator 150, which is representative of conventional television broadcasting circuitry, for transmission of the broadcast HDTV signal on broadcast channel 200.

Figure 2:
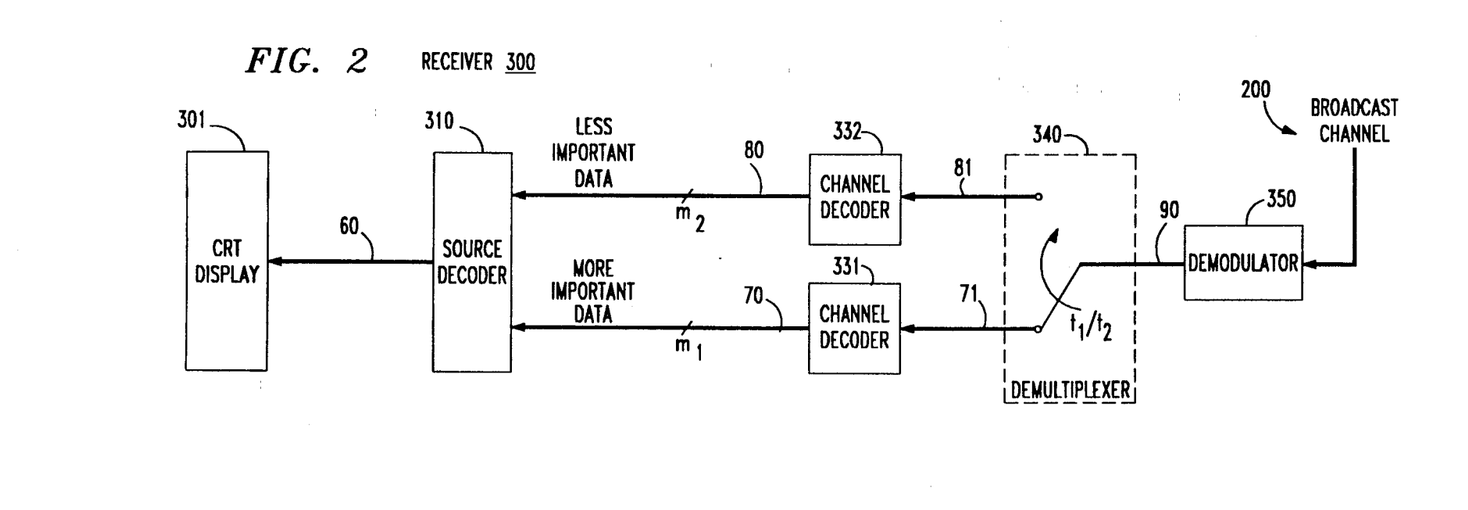
FIG. 2 is a block diagram of an illustrative receiver embodying the principles of the invention.

The broadcast HDTV signal is received from broadcast channel 200 by receiver 300 which is shown in FIG. 2. The broadcast HDTV signal is received by demodulator 350 which is representative of conventional reception and demodulation circuitry, e.g., the antenna, demodulation, analog-to-digital conversion, etc. Demodulator 350 provides a time-multiplexed digital signal representing the received coded outputs on lead 90 which is processed by demultiplexer 340 to provide the separate received coded outputs. The received coded output representing the more important data is provided to channel decoder 331 and the received coded output representing the less important data is provided to channel decoder 332. Channel decoder 331 (332) decodes the received coded output representing the more important (less important) data to provide the more important (less important) data, i.e., class of information, to source decoder 310. Source decoder 310 provides the inverse function of source encoder 110 of transmitter 100 to provide the received HDTV signal to CRT display 301.

Figure 3:
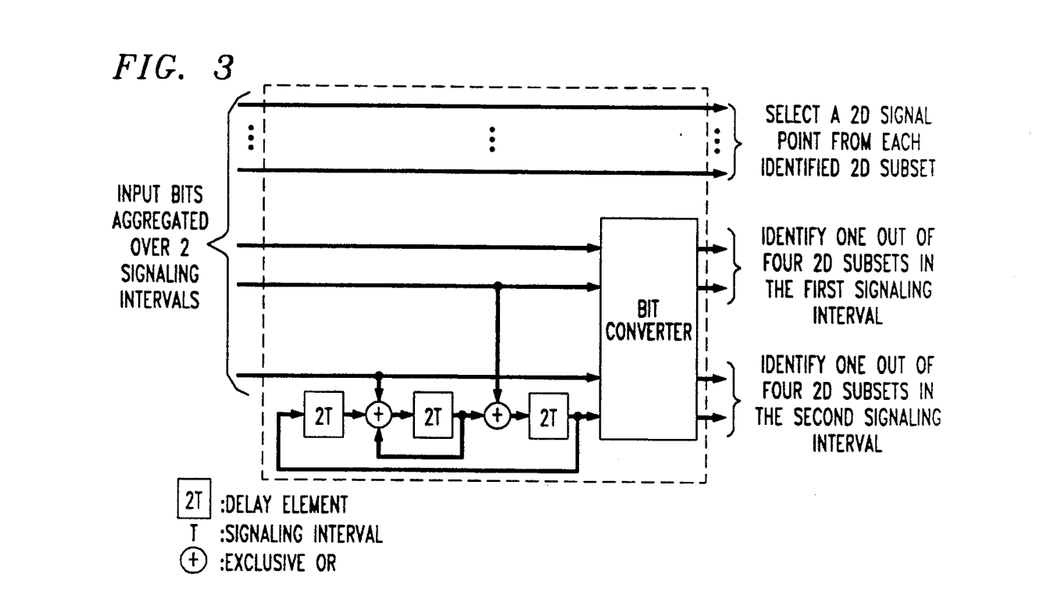
FIGS. 3-4 when taken together, show an illustrative trellis encoder used scheme using a 12-QAM signal constellation and a 48-QAM constellation in the transmitter of FIG. 1.
Figure 4:
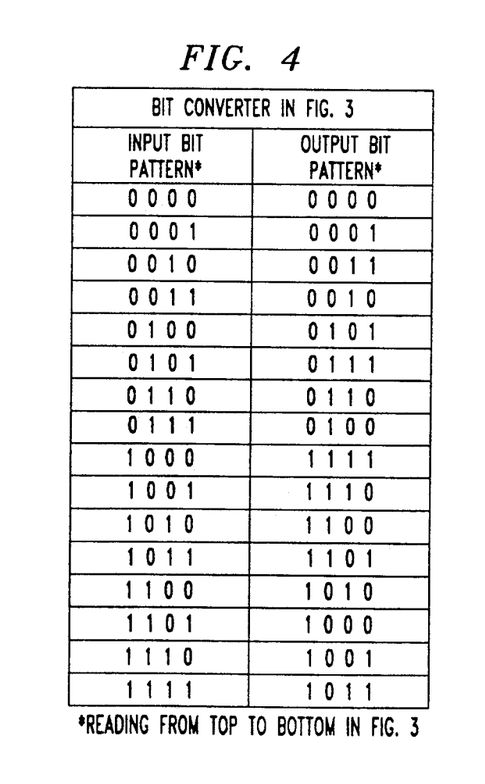

Having described the general inventive concept above, various illustrative embodiments of a multiplexed coded modulation scheme will now be described. Although any coded modulation scheme can be implemented in coded modulation circuitry 120 and 130, the present invention advantageously allows the use of simple channel encoders and constellations of uniformly spaced signal points. For the remainder of the discussion, it is assumed that channel encoders 121 and 131 are implemented using a simple 4D 8-state trellis encoder as shown in FIGS. 3–4 (in FIG. 3, the boxes labeled "T" are T-second delay elements, the circles labeled "+" are exclusive-or gates, and the bit-converter operates in accordance with FIG. 4). Further, it will be assumed that signal constellations 122 and 132 are representative of uniformly-spaced QAM constellations and, although differing in size (i.e., numbers of signal points), have the same average power (average energy per signal point).

Figure 5:
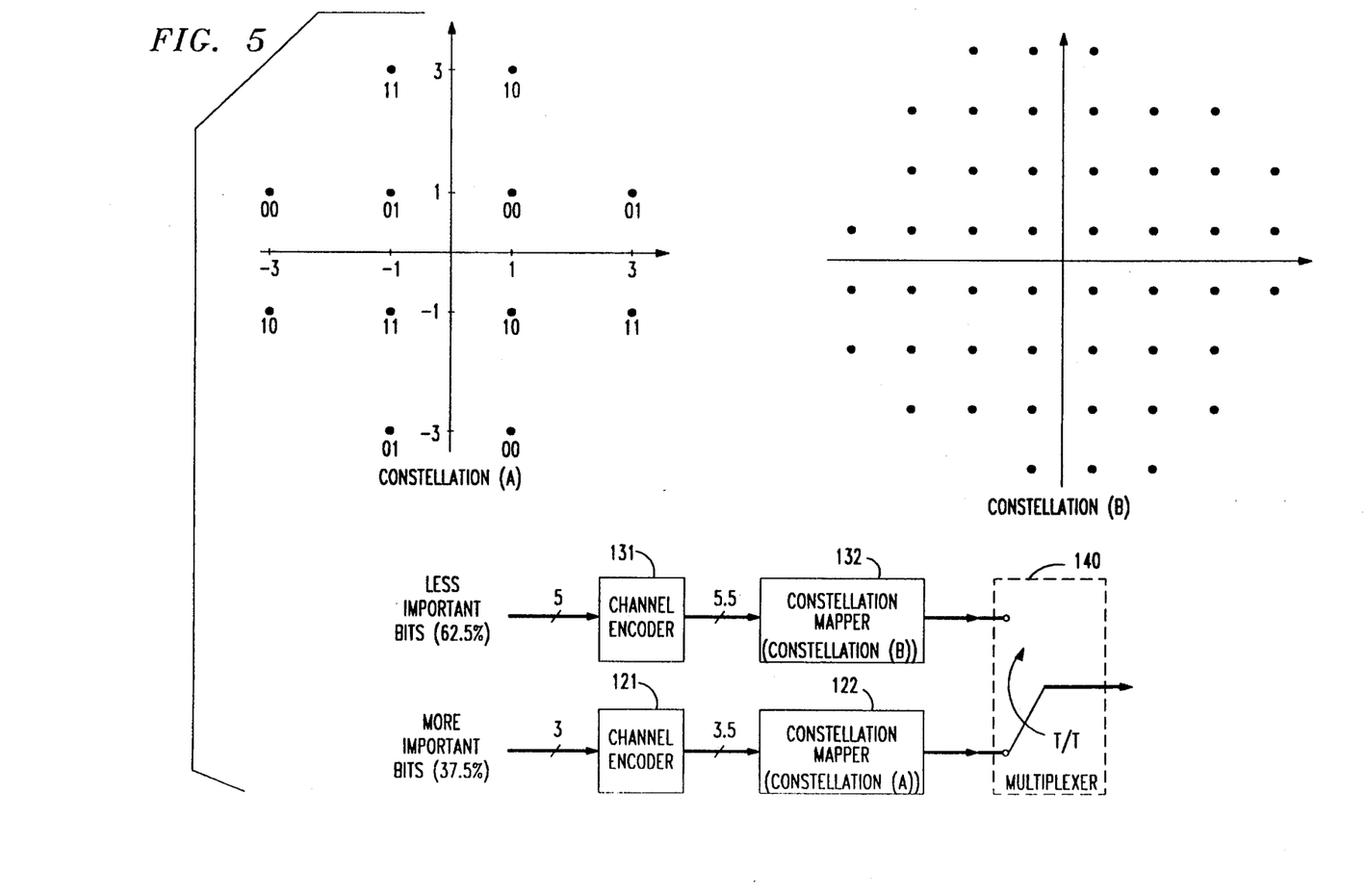
FIG. 5 shows an embodiment of a multiplexed coded modulation scheme using a 12-QAM signal constellation and a 48-QAM constellation in the transmitter of FIG. 1.
Figure 6:
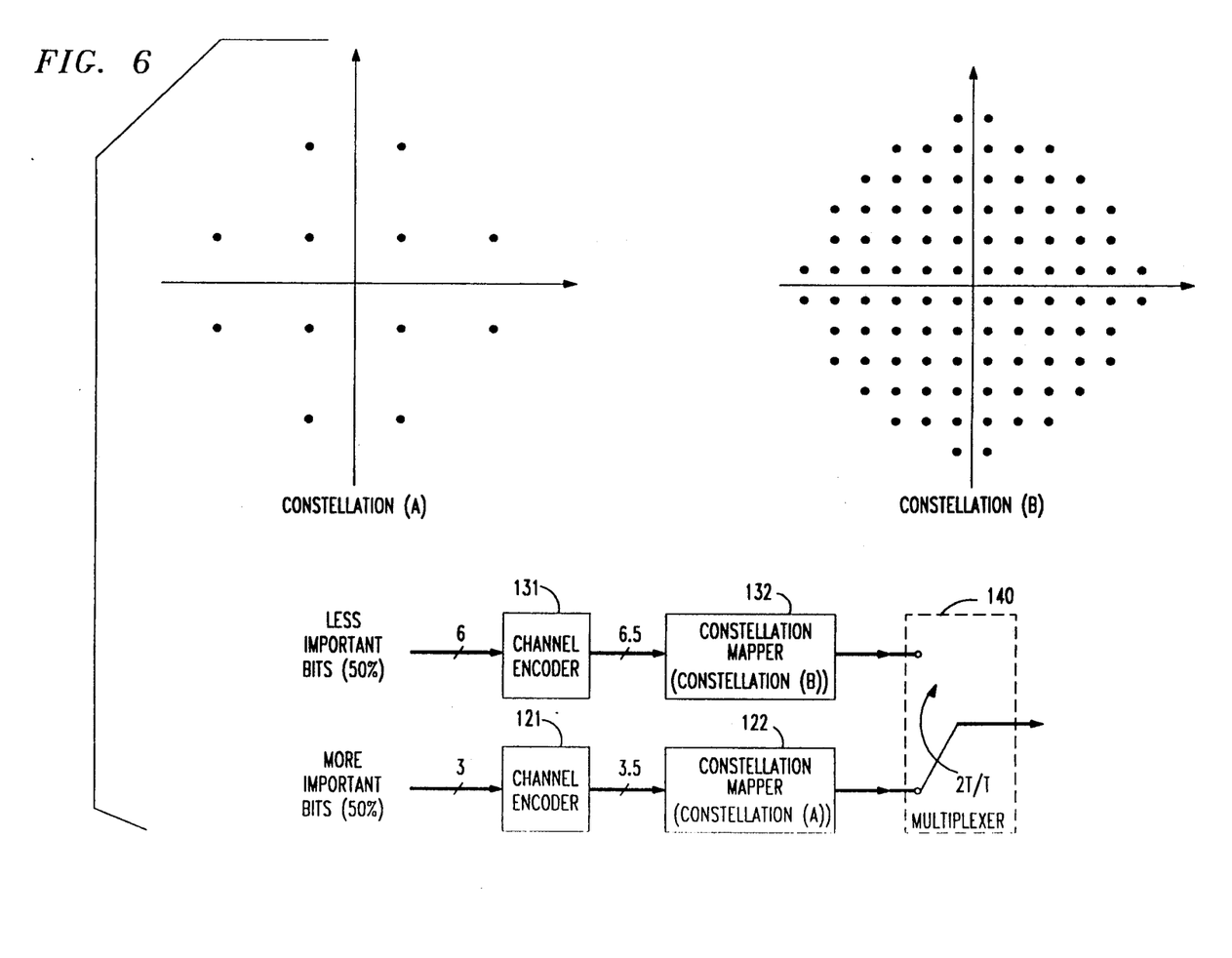
FIG. 6 shows an alternative embodiment of a multiplexed coded modulation scheme using a 12-QAM signal constellation and a 96-QAM constellation in the transmitter of FIG. 1.
Figure 7:
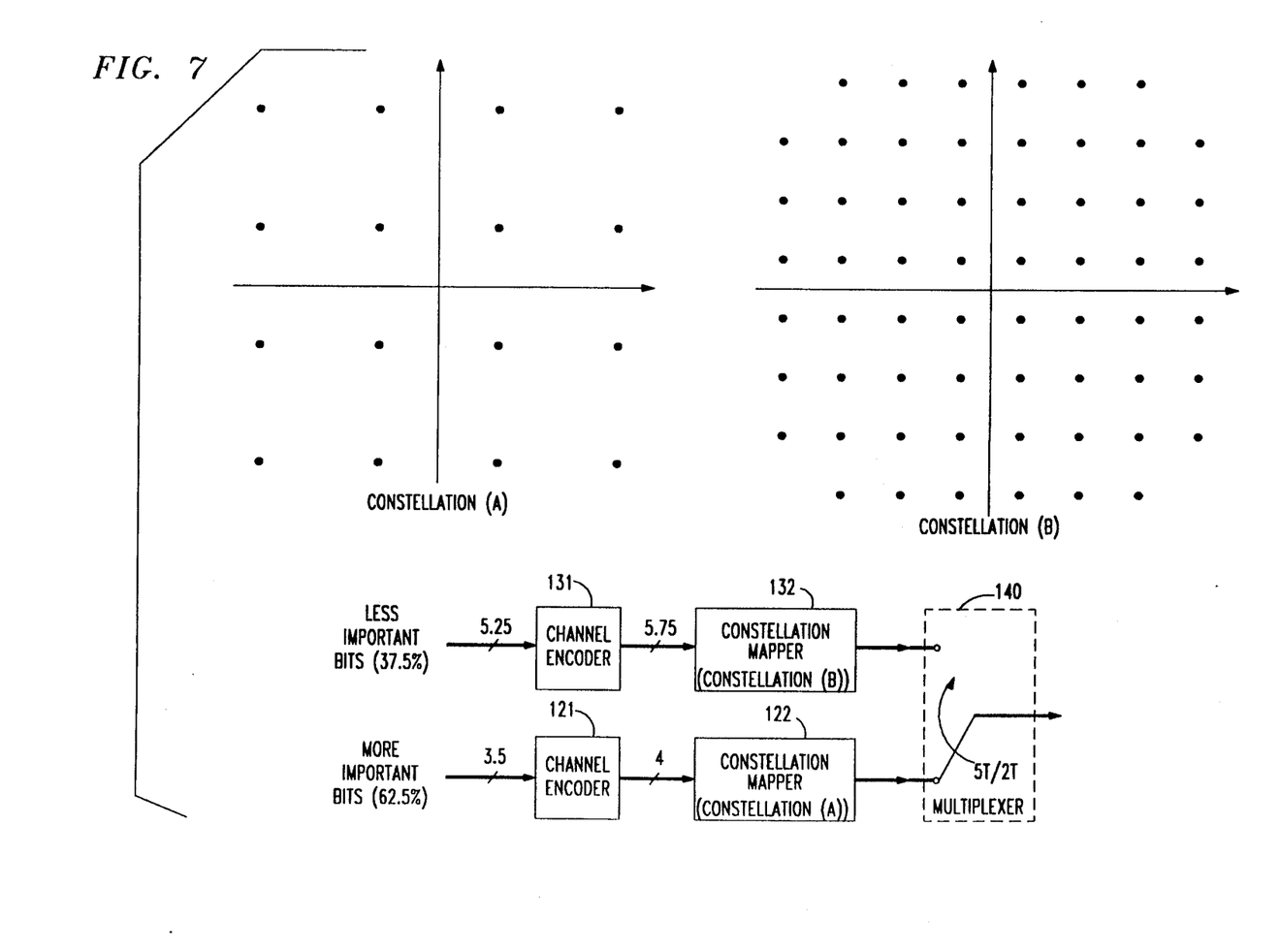
FIG. 7 shows another alternative embodiment of a multiplexed coded modulation scheme using a 16-QAM signal constellation and a 60-QAM constellation in the transmitter of FIG. 1.
Figure 8:
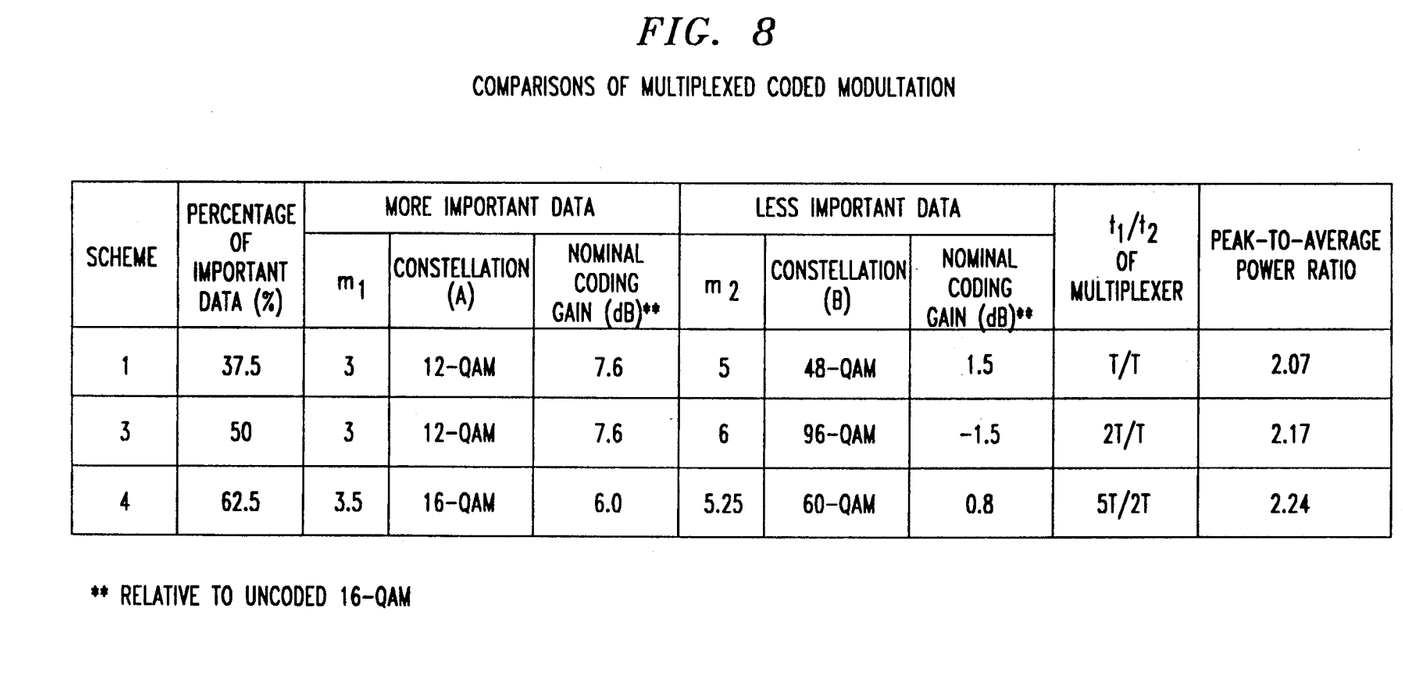
FIG. 8 shows a table comparing the nominal coding gains for the three embodiments of FIGS. 5-7.

FIGS. 5–7 illustrate a variety of embodiments of an illustrative multiplexed coded modulation scheme for different a) values of $m_1$ and $m_2$, b) QAM signal constellations, and c) $t_1/t_2$ multiplexer ratios. FIG. 8 lists various characteristics of these embodiments. The bandwidth efficiency each of these embodiments is four data bits per signaling interval, with the percentage of more important data varying from 37.5% to 62.5% of the total. (It should be noted that these embodiments are for comparison purposes only, e.g., other bandwidth efficiencies can be used, different signal constellations can be used (with different sizes), etc.) For example, applying the above mentioned bandwidth efficiency formula to the embodiment shown in FIG. 5, i.e., $(m_1 = 3, m_2 = 5)$, and $(t_1 = t_2 = T)$ yields four data bits per signaling interval:

$$\frac{(m_1 t_1 + m_2 t_2)}{t_1 + t_2} = \frac{3T + 5T}{T + T} = 4$$

In each embodiment, the sizes of the signal constellations and the nominal coding gains for the more important and less important data are determined based on the above assumption that the simple 4D 8-state trellis code of FIGS. 3–4 is used in both channel encoders 121 and 131.

It should be observed in FIG. 3 that two input bits are coded every two signal intervals to provide three encoded bits (i.e., the delay element of the 4D 8-state trellis code is 2T signaling intervals). The three encoded bits, together with an uncoded input bit, are then converted into two pairs of output bits through the bit converter of FIG. 4. Each pair of output bits is next used to identify, in the first or second signaling intervals, one out of four 2D subsets of signal points, as shown by the example of constellation (A) in FIG. 5, where each subset identified by a two bit pattern consists of these signal points. The four 2D subsets are obtained by partitioning the corresponding constellation so that the distance between the signal points in each subset is greater than that between the signal points of the overall constellations, as in the conventional coded modulation. Any number of input bits in excess of three will remain uncoded and be used to select a 2D signal point from each of the two identified 2D subsets (some processing on the uncoded bits may be needed in order to simplify the selection process, e.g., see U.S. Pat. No. 4,941,154, issued Jul. 10, 1990 to L. -F. Wei, and "Multidimensional constellations-Part I: Introduction, figures of merit, and generalized cross constellations," G. D. Forney, Jr. & L. -F. Wei, *IEEE J. Select. Areas Commun.*, vol. SAC-7, pp. 877–892, August 1989).

In each embodiment the real coding gain is expected to be less than its corresponding nominal coding gain, which is due to the large error coefficient associated with the Minimum Squared Euclidean Distance (MSED) of the 4D 8-state trellis code. The Peak-to-Average Power Ratio (PAR) of the three embodiments are determined by the larger constellations used for the less important data, which are all slightly bigger than two.

Figure 9:
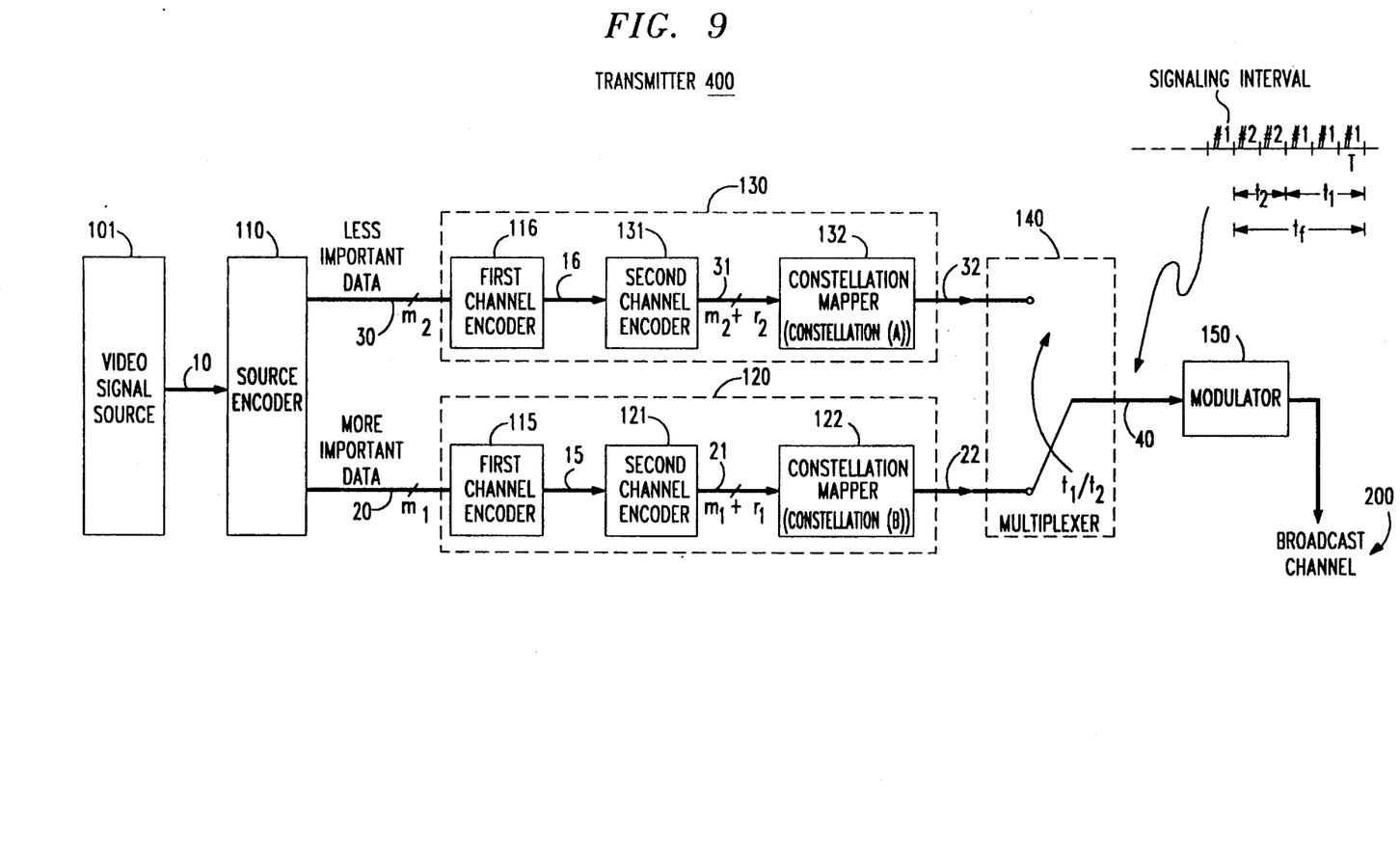
FIG. 9 is a block diagram of an illustrative transmitter embodying the principles of the invention using a concatenated coding technique.

It may also be noted that additional coded modulation schemes can be implemented within a multiplexed coded modulation scheme to protect against other forms of noise that may be present in a communications system. For example, the conventional coded modulation schemes used in FIGS. 5–7 are not effective against impulse noise, so a well-known Reed-Solomon code which is effective against impulse noise can be used in conjunction with a trellis code to form a concatenated code. A block diagram of an illustrative embodiment using a concatenated code is shown in FIG. 9. In FIG. 9, the more (less) important data is first separately encoded by first channel encoder 115 (116) which uses a well-known Reed-Solomon code (i.e., additional redundant bits are added to $m_1$ ($m_2$)), and then further encoded by second channel encoder 121 (131) using the trellis code described above (it should be noted that channel encoder 121 (131) and constellation mapper 122 (132) have to be modified accordingly to handle the additional redundant bits introduced by first channel encoder 115 (116)).

The foregoing merely illustrates the principles of the invention. For example, although the invention is illustrated herein as being implemented with discrete functional building blocks, e.g., source decoders, channel encoders, etc., the functions of any one or more of those building blocks can be carried out using one or more appropriate programmed processors, digital signal processing (DSP) chips, etc. In addition, the invention could be implemented such that some of the discrete functional blocks were shared in time, e.g., physically using only one channel encoder that is switched between two signal constellations. Also, the coded modulation scheme for each class of information can be enhanced using interleaving techniques, or more complex coded modulation schemes, to protect against other forms of noise, e.g., to protect against "colored" noise. Further, other multiplexing techniques may be used in place of time-division-multiplexing.

It will thus be appreciated that those skilled in the art will be able to devise numerous and various alternative arrangements which, although not explicitly shown or described herein, embody the principles of the invention and are within its spirit and scope.

We claim:

1. A method for processing an information signal, the information signal being comprised of a plurality of classes of information, the method comprising the steps of:
    separately coding each one of the plurality of classes of information using a separate coded modulation scheme to provide a coded output, such that one of the plurality of classes of information has more error protection than the remaining ones of the plurality of classes of information, where each one of the plurality of coded outputs comprises a plurality of signal points taken from a signal point constellation and where the signal point constellation of at least one of the coded modulation schemes is different from the signal point constellations of the remaining coded modulation schemes; and
    multiplexing the plurality of coded outputs for transmission.

2. The method of claim 1 wherein the multiplexing step is time-division-multiplexing.

3. The method of claim 2 wherein the multiplexing step includes the step of assigning each one of the plurality of coded outputs to a time interval in a time frame, the time frame being greater than or equal to the sum of the plurality of assigned time intervals.

4. The method of claim 3 wherein at least one of the plurality of time intervals is longer in duration than the remaining ones of the plurality of the time intervals, and said longer time interval is assigned to the one of the plurality of classes of information that has more error protection.

5. The method of claim 1 wherein the information signal is an HDTV signal.

6. The method of claim 1 wherein the separately coding step includes the step of:
    encoding each one of the plurality of classes of information to provide an encoded output; and
    mapping each one of the plurality of encoded outputs to a signal point of the respective signal point constellation to provide the coded output.

7. The method of claim 6 wherein each one of the plurality of classes of information is comprised of a plurality of data bits.

8. The method of claim 6 wherein the encoding step comprises the step of trellis coding.

9. The method of claim 6 wherein the encoding step comprises the step of encoding with a concatenated code.

10. The method of claim 9 wherein the concatenated code is comprised of a Reed-solomon code and a trellis code.

11. A method for providing unequal error protection for an information signal, the information signal being comprised of a plurality of classes of information, the method comprising the steps of:
    assigning each one of the plurality of classes of information to a coded modulation scheme such that at least one of the plurality of classes of information is assigned to a different coded modulation scheme than the remaining ones of the plurality of classes of information;
    assigning a time interval to each one of the plurality of coded modulation schemes such that at least one of the plurality of coded modulation schemes is assigned to a different time interval than the remaining ones of the plurality of coded modulation schemes; and
    separately coding each one of the plurality of classes of information using the assigned coded modulation scheme in the assigned time interval to provide a coded output for transmission such that at least one of the plurality of classes of information has more error protection than the remaining ones of the plurality of classes of information;
    where each one of the coded outputs comprises a plurality of signal points taken from a signal point constellation and where the signal point constellation of at least one of the coded modulation schemes is different from the signal point constellations of the remaining coded modulation schemes.

12. The method of claim 11 wherein at least one of the plurality of assigned time intervals is longer in duration than the remaining ones of the plurality of assigned time intervals, and said longer time interval is assigned to the one of the plurality of classes of information that has more error protection.

13. The method of claim 11 wherein the information signal is an HDTV signal.

14. The method of claim 11 wherein each one of the plurality of classes of information is comprised of m data bits occurring per T second signaling interval, where $m>0$ for each one of the plurality of classes of information, and $T>0$.

15. The method of claim 14 wherein the separately coding step includes the steps of:
    encoding the m data bits each for each T second signaling interval occurring in the assigned time interval to provide m+r data bits per T second signaling interval, where r>0 and is the average number of redundant data bits; and mapping each one of the m+r data bits occurring each signaling interval in the assigned time interval to a signal point from a signal constellation to provide the signal point each signaling interval in the assigned time interval as the coded output.

16. The method of claim 15 wherein the encoding step comprises the step of trellis coding.

17. The method of claim 15 wherein the encoding step comprises the step of encoding with a concatenated code.

18. The method of claim 15 wherein the concatenate code is comprised of a Reed-Solomon code and a trellis code.

19. Apparatus for processing an information signal, the information signal being comprised of a plurality of classes of information, the apparatus being comprised of:

source encoding means responsive to the information signal for providing the plurality of classes of information;

coding means responsive to the plurality of classes of information for separately coding each one of the plurality of classes of information using a separate coded modulation scheme to provide a coded output for each one of the plurality of classes of information such that at least one of the plurality of classes of information has more error protection then the remaining ones of the plurality of classes of information, where each one of the coded outputs comprises a plurality of signal points taken from a signal point constellation and where the signal point constellation of at least one of the coded modulation schemes is different from the signal point constellations of the remaining coded modulation schemes; and means for multiplexing the plurality of coded outputs for transmission.

20. The apparatus of claim 19 wherein the means for multiplexing operates in accordance with time-division-multiplexing.

21. The apparatus of claim 19 wherein the means for multiplexing assigns each one of the plurality of coded outputs to a time interval in a time frame, the time frame being greater than or equal to the sum of the plurality of assigned time intervals.

22. The apparatus of claim 19 wherein at least one of the plurality of time intervals is longer in duration than the remaining ones of the plurality of time intervals, and said longer time interval is assigned to the one of the plurality of classes of information that has more error protection.

23. The apparatus of claim 19 wherein the information signal is an HDTV signal.

24. The apparatus of claim 19 wherein the coding means is further comprised of:

means for channel encoding each one the plurality of classes of information to provide an encoded output; and means for mapping each one of the encoded outputs to signal point of a signal constellation to provide the coded output.

25. The apparatus of claim 24 wherein at least one of the plurality of encoded outputs is mapped to a signal constellation of different size than the remaining ones of the plurality of encoded outputs.

26. The apparatus of claim 24 wherein each one of the plurality of classes of information is comprised of a plurality of data bits.

27. The apparatus of claim 24 wherein the means for channel encoding encodes using a trellis code.

28. The apparatus of claim 24 wherein the means for channel encoding encodes using a concatenated code.

29. The apparatus of claim 28 wherein the concatenated code is comprised of a Reed-Solomon code and a trellis code.

30. Apparatus for decoding a received signal, the received signal representing a stream of signal points, the apparatus being comprised of:

means for demultiplexing the stream of signal points to provide a plurality of coded outputs, where each one of the plurality of coded outputs comprises a portion of the signal points from the stream of signal points and represents a class of information wherein one said coded outputs provides more error protection to its class of information than the remainder of said coded outputs to their classes of information;

a plurality of means for decoding, where each one of the plurality of means for decoding decodes one of the plurality of coded outputs to provide one of the plurality of classes of information; and means for source decoding the plurality of classes of information to provide an information signal.

31. The apparatus of claim 30 wherein the information signal is an HDTV signal.

32. The apparatus of claim 30 wherein the means for demultiplexing operates in accordance with time-division-demultiplexing.

* * * * *